United States Patent
Takabayashi

(10) Patent No.: US 12,176,820 B2
(45) Date of Patent: Dec. 24, 2024

(54) SUPPORT INSULATOR AND POWER CONVERSION DEVICE

(71) Applicant: Mitsubishi Electric Corporation, Tokyo (JP)

(72) Inventor: Hirokazu Takabayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 180 days.

(21) Appl. No.: 18/004,732

(22) PCT Filed: Aug. 3, 2020

(86) PCT No.: PCT/JP2020/029643
§ 371 (c)(1),
(2) Date: Jan. 9, 2023

(87) PCT Pub. No.: WO2022/029829
PCT Pub. Date: Feb. 10, 2022

(65) Prior Publication Data
US 2023/0253892 A1     Aug. 10, 2023

(51) Int. Cl.
*H05K 7/14* (2006.01)
*H02M 7/00* (2006.01)

(52) U.S. Cl.
CPC ............. *H02M 7/003* (2013.01); *H05K 7/14* (2013.01)

(58) Field of Classification Search
CPC ..... H05K 7/14; H05K 7/14329; H02M 7/003; H02G 5/025
USPC ....................................................... 361/807
See application file for complete search history.

(56) References Cited

U.S. PATENT DOCUMENTS

| | | | |
|---|---|---|---|
| 10,091,903 B2 | 10/2018 | Hara et al. | |
| 2013/0058143 A1* | 3/2013 | Tachibana | H05K 7/14329 363/131 |
| 2018/0175362 A1* | 6/2018 | Hara | H01M 50/209 |
| 2019/0348828 A1* | 11/2019 | Preising | H05K 7/1432 |
| 2019/0361053 A1 | 11/2019 | Kosuga et al. | |

FOREIGN PATENT DOCUMENTS

JP     H0947034 A     2/1997

OTHER PUBLICATIONS

International Search Report (PCT/ISA/210) with English translation and Written Opinion (PCT/ISA/237) mailed on Oct. 6, 2020, by the Japan Patent Office as the International Searching Authority for International Application No. PCT/JP2020/029643.
Office Action dated Mar. 22, 2023, issued in the corresponding Indian Patent Application No. 202227070453, 7 pages.

* cited by examiner

*Primary Examiner* — Timothy J Thompson
*Assistant Examiner* — Michael F McAllister
(74) *Attorney, Agent, or Firm* — Buchanan Ingersoll & Rooney PC

(57) ABSTRACT

A support insulator includes a conductive member, an insulating member, and an attachment portion. Busbars included in a main circuit are attachable to the conductive member. The conductive member electrically connects the busbars to each other. The insulating member is attachable to a fixed frame, and is disposed over an outer surface of the conductive member to insulate the conductive member and the busbars from the fixed frame. An electronic component included in the main circuit is attachable to the attachment portion.

13 Claims, 23 Drawing Sheets

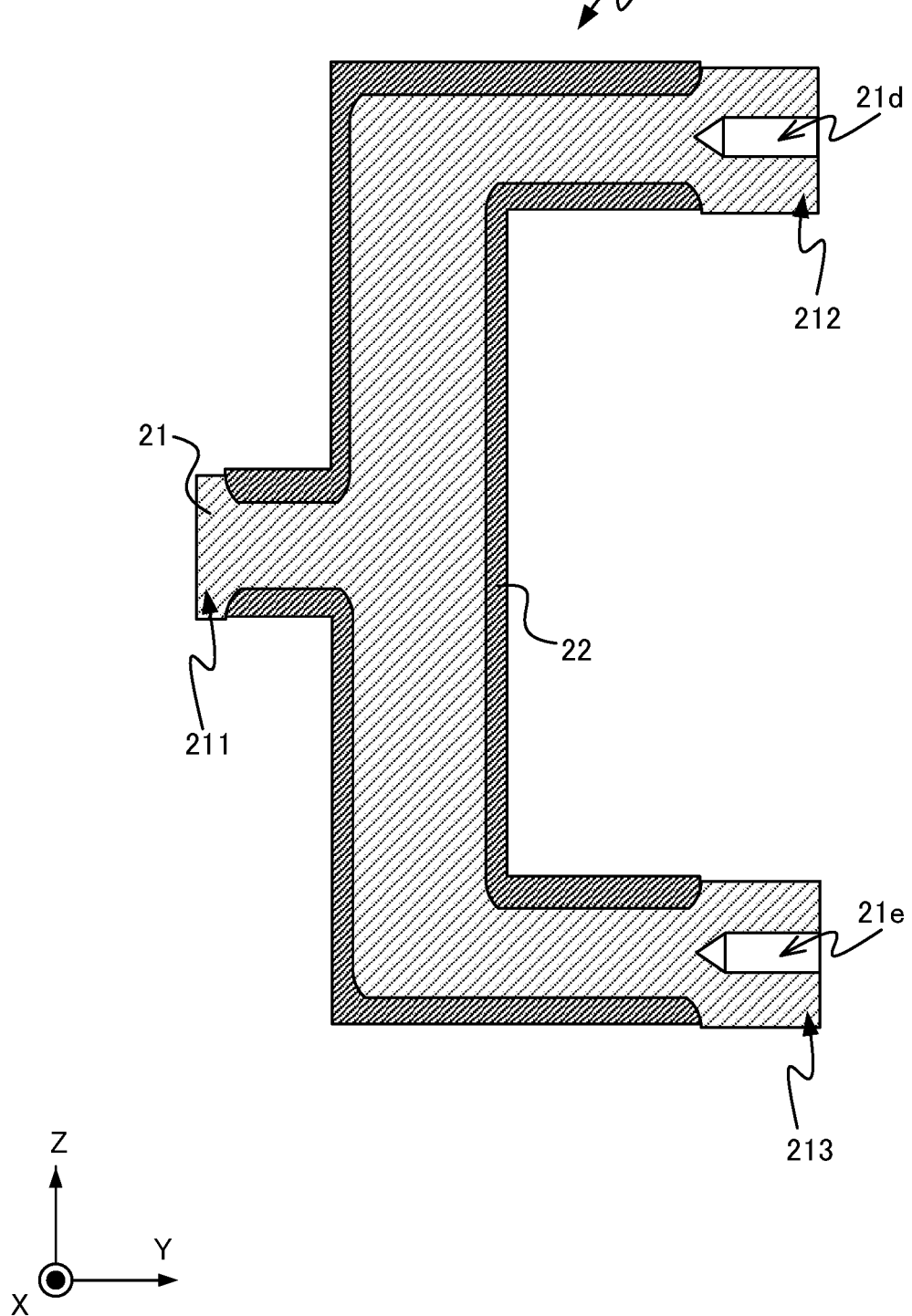

SUPPORT INSULATOR AND POWER CONVERSION DEVICE

TECHNICAL FIELD

The present disclosure relates to a support insulator and a power conversion device.

BACKGROUND ART

Some electric railway vehicles are provided with a power conversion device to convert DC power fed from a substation via an overhead wire into desired AC power and feed the converted AC power to a motor. An example of this type of power conversion device is disclosed in Patent Literature 1. This power conversion device measures values of phase current in the U, V, and W phases flowing in the motor, and calculates an actual torque of the motor from the measured values of phase current. The power conversion device then executes control processes such that the actual torque approaches the target torque.

CITATION LIST

Patent Literature

Patent Literature 1: Unexamined Japanese Patent Application Publication No. H9-47034

SUMMARY OF INVENTION

Technical Problem

The power conversion device disclosed in Patent Literature 1 includes current sensors of a current transformer (CT) type in order to measure values of phase current. Each of the current sensors of a CT type measures a value of current based on a variation in magnetic flux generated in a ring-shaped magnetic core in response to current flowing in a conductor disposed through the magnetic core. The current sensor of a CT type thus has a ring-shaped case for accommodating the magnetic core and is fixed to a busbar with the busbar received through the case. In order to fix the current sensors of a CT type to a frame, the power conversion device needs to further include the frame for attachment thereto of the current sensors. Each of the current sensors therefore preferably has a structure that enables direct attachment thereof to the busbar.

A power conversion device installed in an electric railway vehicle receives vibration during running of the vehicle. The busbars accordingly receive vibration, and the current sensors attached to the busbars also receive vibration. A current sensor attached at a position distant from the fixed point of a busbar receives larger vibration. The current sensor continuously used while receiving vibration may malfunction. This problem can occur in not only the current sensor but also any electronic component attached to a busbar included in a main circuit.

The present disclosure is made in view of the above situations, and an objective of the present disclosure is to provide a support insulator and a power conversion device that can reduce vibration received at an electronic component.

Solution to Problem

In order to achieve the above objective, a support insulator according to an aspect of the present disclosure supports a plurality of busbars included in a main circuit. The support insulator includes a conductive member, an insulating member, and an attachment portion. The busbars are attachable to the conductive member. The conductive member electrically connects the busbars to each other. The insulating member is attachable to a fixed frame fixed to a housing for accommodating the main circuit. The insulating member is disposed over an outer surface of the conductive member to insulate the conductive member and the busbars from the fixed frame. An electronic component included in the main circuit is attachable to the attachment portion.

Advantageous Effects of Invention

According to the present disclosure, the electronic component is fixable to the support insulator attached to the fixed frame. This configuration enables reducing vibration received at the electronic component.

BRIEF DESCRIPTION OF DRAWINGS

FIG. 23 is another cross-sectional view of the support insulator according to the modification of the embodiments.

DESCRIPTION OF EMBODIMENTS

Figure 1:
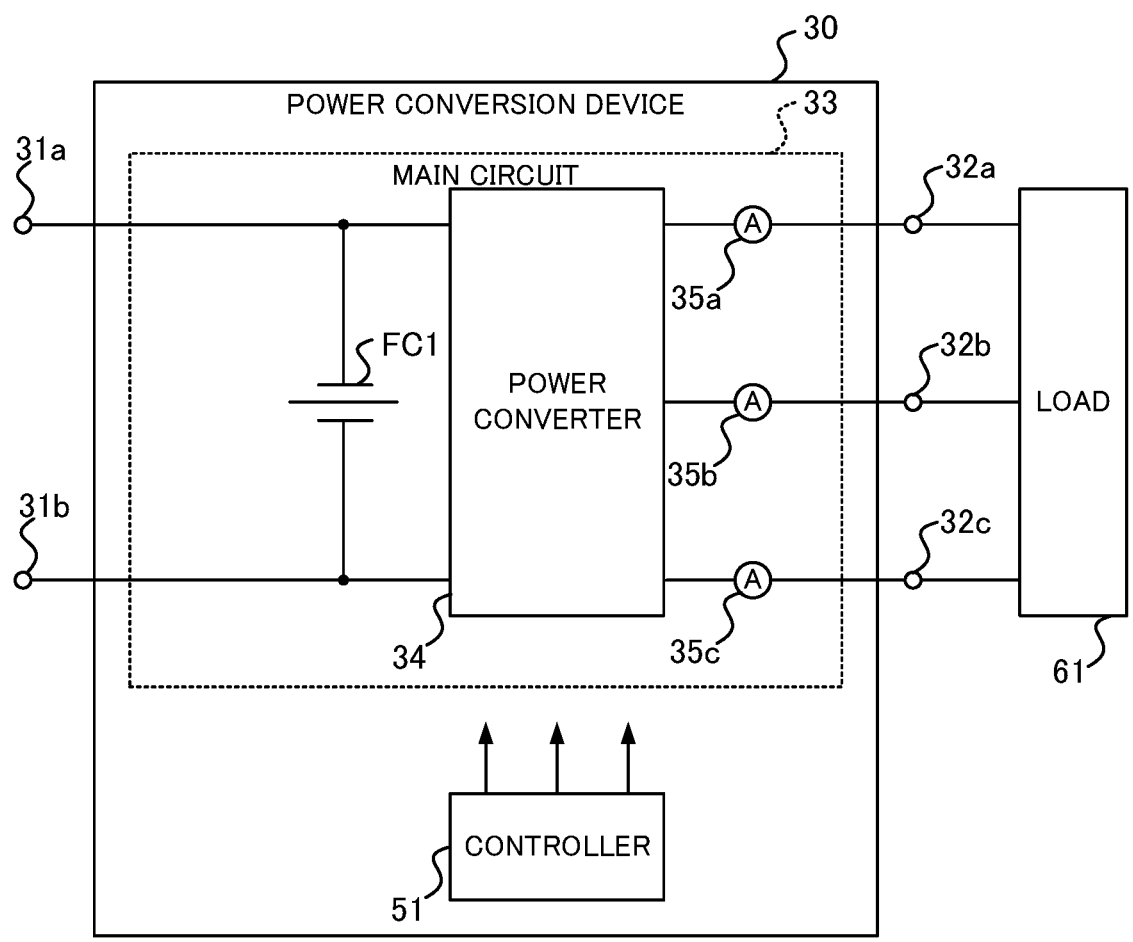
FIG. 1 is a circuit diagram of a power conversion device according to Embodiment 1.

A power conversion device according to embodiments of the present disclosure is described in detail below with reference to the accompanying drawings. In the drawings, the components identical or corresponding to each other are assigned the same reference sign.

Embodiment 1

The following description is directed to a power conversion device 30 according to Embodiment 1 and a support insulator 1 included in the power conversion device 30, focusing on an exemplary power conversion device installed in a vehicle.

The power conversion device 30 illustrated in FIG. 1 includes a positive input terminal 31a, a negative input terminal 31b, and output terminals 32a, 32b, and 32c. The power conversion device 30 further includes a power converter 34 to convert DC power fed from a power source into electric power for driving a load 61 and feed the converted electric power to the load 61, a filter capacitor FC1 connected between the terminals of the power converter 34 adjacent to the power source, current sensors 35a, 35b, and 35c to measure values of current output from the power converter 34, and a controller 51 to control switching elements included in the power converter 34.

The filter capacitor FC1 and the power converter 34 in which high-voltage current flows, and the current sensors 35a, 35b, and 35c to measure values of the high-voltage current are collectively called a main circuit 33. The high-voltage current means, for example, direct current at a voltage of 400 V or higher and 1,500 V or lower, or alternating current providing an effective value of voltage of 200 V or higher and 1,000 V or lower.

The components of the main circuit 33, such as the filter capacitor FC1 and the power converter 34, are connected to each other via busbars. In addition, the positive input terminal 31a, the negative input terminal 31b, and the output terminals 32a, 32b, and 32c are connected to the respective components of the main circuit 33 via busbars. The power conversion device 30 includes support insulators 1, which are described below, to support these busbars while electrically connecting the busbars to each other. Electronic components included in the main circuit 33 are attachable to the support insulators 1.

Each of the support insulators 1 according to Embodiment 1 is described below that can reduce vibration received at an electronic component included in the main circuit 33. Specifically, the support insulator 1 according to Embodiment 1 is described focusing on an exemplary support insulator to support a busbar connected to the power converter 34 and a busbar connected to the output terminal 32a while electrically connecting the busbars to each other. The description assumes that the support insulator is attached to the current sensor 35a, which is an example of the electronic components included in the main circuit 33. The current sensors 35a, 35b, and 35c have the configuration identical to each other and are attachable to the support insulators 1 by the same procedure.

Figure 2:
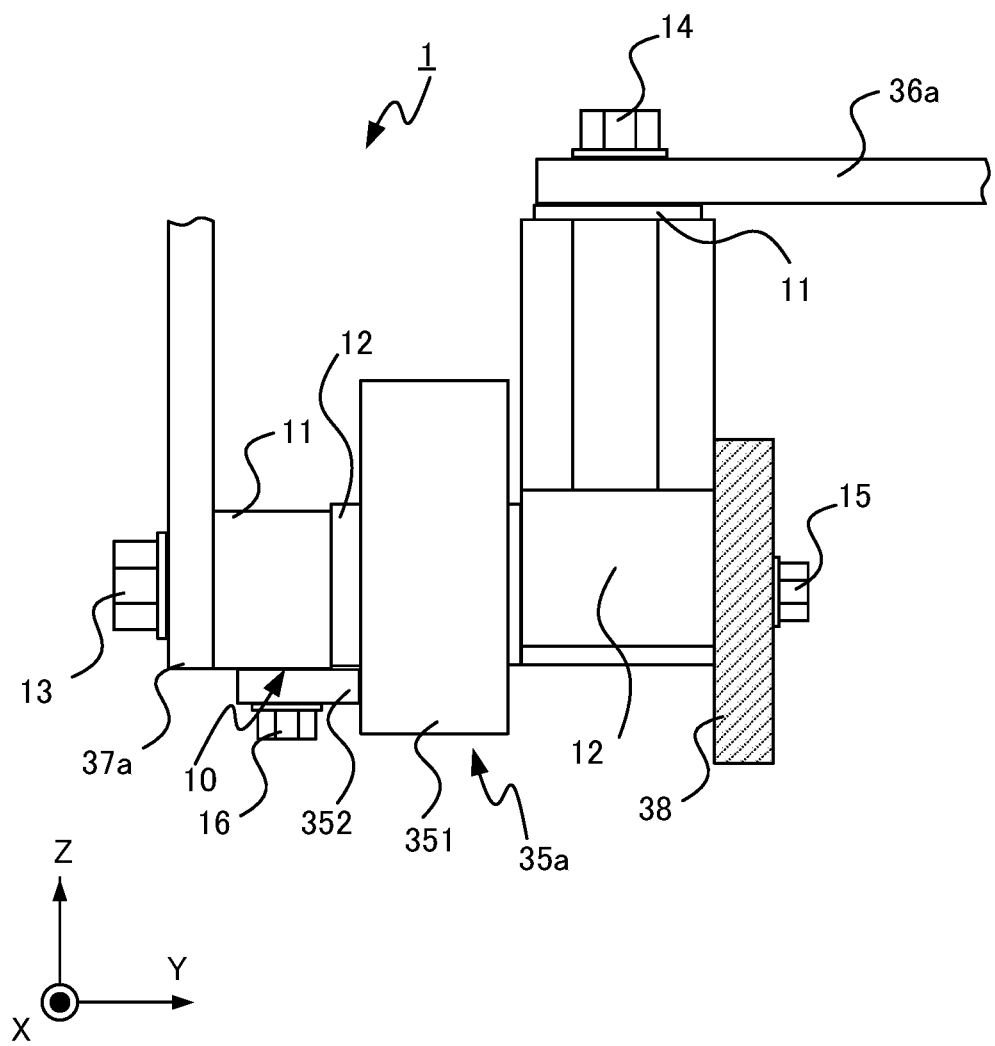
FIG. 2 is a side view illustrating an exemplary manner of fixation of a current sensor to a support insulator according to Embodiment 1.
Figure 3:
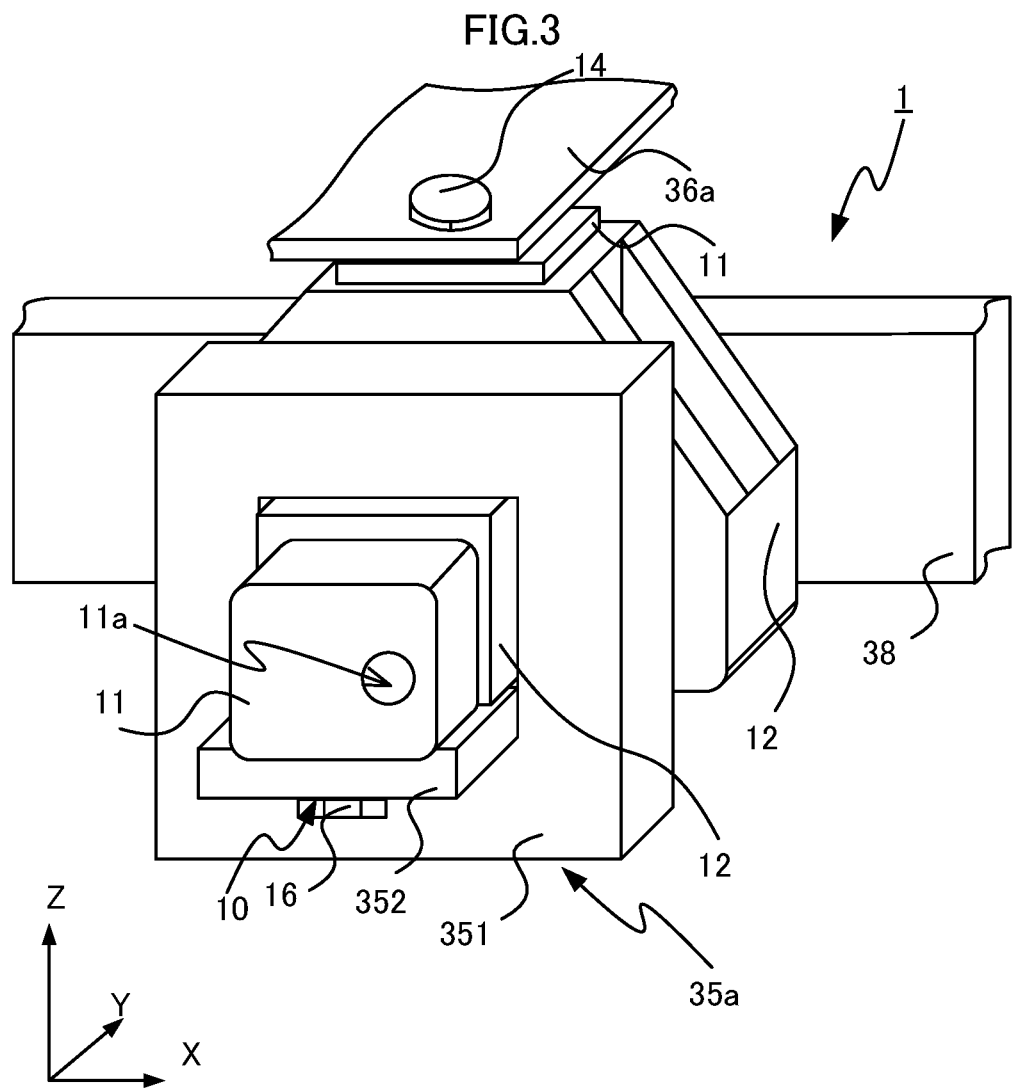
FIG. 3 is a perspective view illustrating an exemplary manner of fixation of the current sensor to the support insulator according to Embodiment 1.
Figure 4:
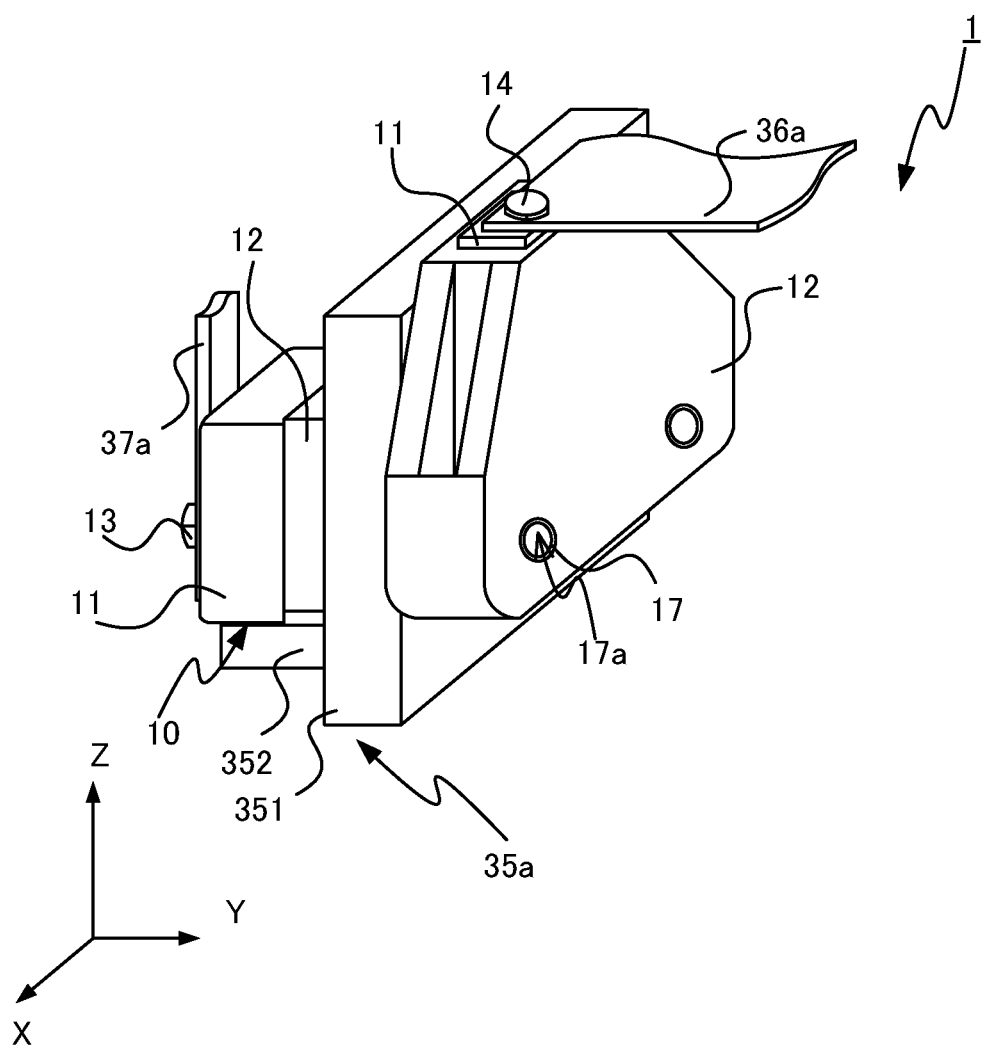
FIG. 4 is another perspective view illustrating an exemplary manner of fixation of the current sensor to the support insulator according to Embodiment 1.

As illustrated in FIGS. 2 to 4, the support insulator 1 supports a busbar 36a connected to the power converter 34 and a busbar 37a connected to the output terminal 32a while electrically connecting these busbars to each other. FIG. 3 does not illustrate the busbar 37a in order to simplify the figure. In FIGS. 2 to 4, the Z-axis direction corresponds to the vertical direction. The Y-axis direction corresponds to the normal line direction of the main surface of the end of the busbar 37a attached to the support insulator 1. The X axis is orthogonal to each of the Y and Z axes.

The following description is directed to the structure of the support insulator 1. The busbar 36a and the busbar 37a are attached to the support insulator 1. In detail, the support insulator 1 includes a conductive member 11 to electrically connect the busbar 36a and the busbar 37a to each other and an insulating member 12 disposed over the outer surface of the conductive member 11.

The conductive member 11 is made of an electrically conductive material, such as copper. The insulating member 12 is disposed over the outer surface of the conductive member 11 with both ends of the conductive member 11 exposed.

In Embodiment 1, the conductive member 11 has a columnar shape bent at an angle of 90°. In detail, the conductive member 11 includes a columnar segment extending in the Y-axis direction and a columnar segment extending in the Z-axis direction.

The busbar 37a is fixed to one end of the conductive member 11 with a fastening member 13. Additionally, the current sensor 35a is fixed to the one end of the conductive member 11 with a fastening member 16. In other words, the one end of the conductive member 11 constitutes an attachment portion 10 to which the current sensor 35a is attachable.

The busbar 36a is fixed to the other end of the conductive member 11 with a fastening member 14.

Figure 5:
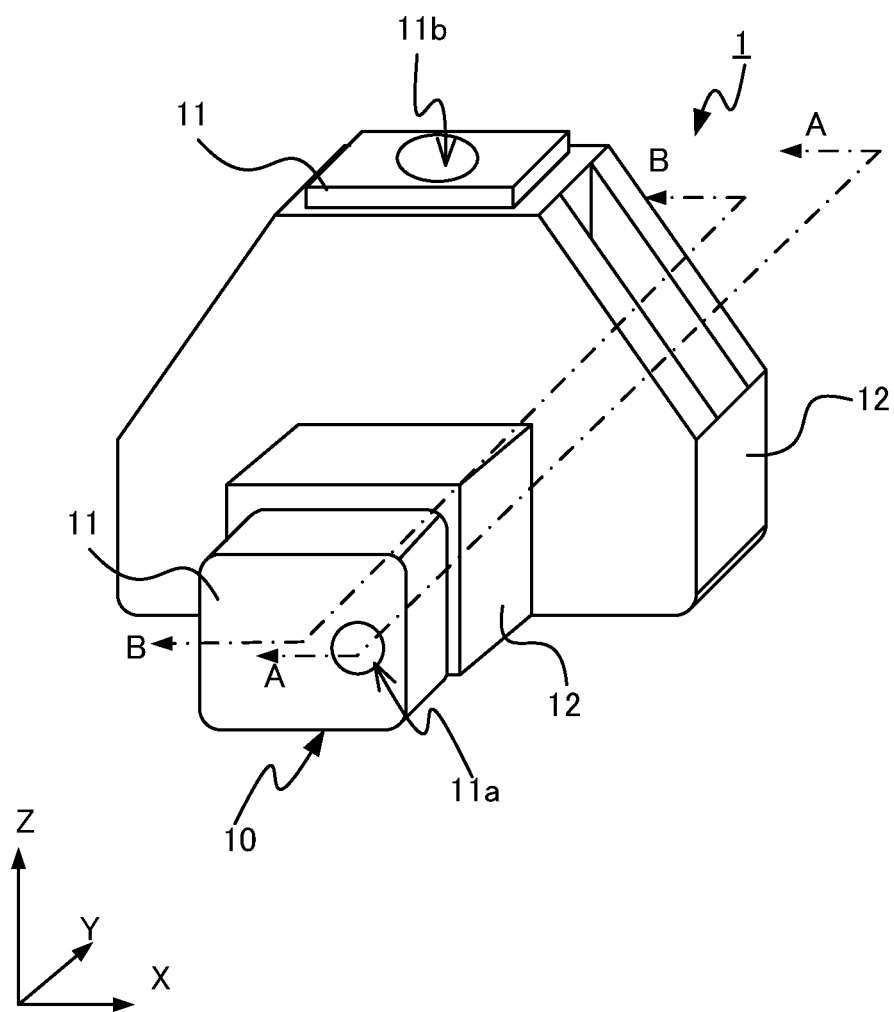
FIG. 5 is a perspective view of the support insulator according to Embodiment 1.
Figure 6:
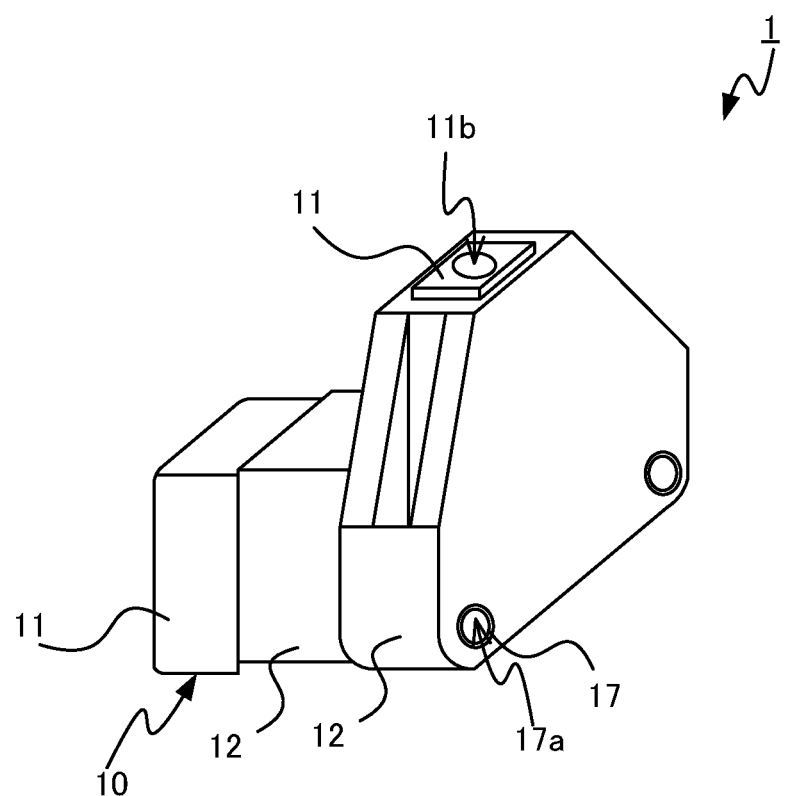
FIG. 6 is another perspective view of the support insulator according to Embodiment 1.
Figure 7:
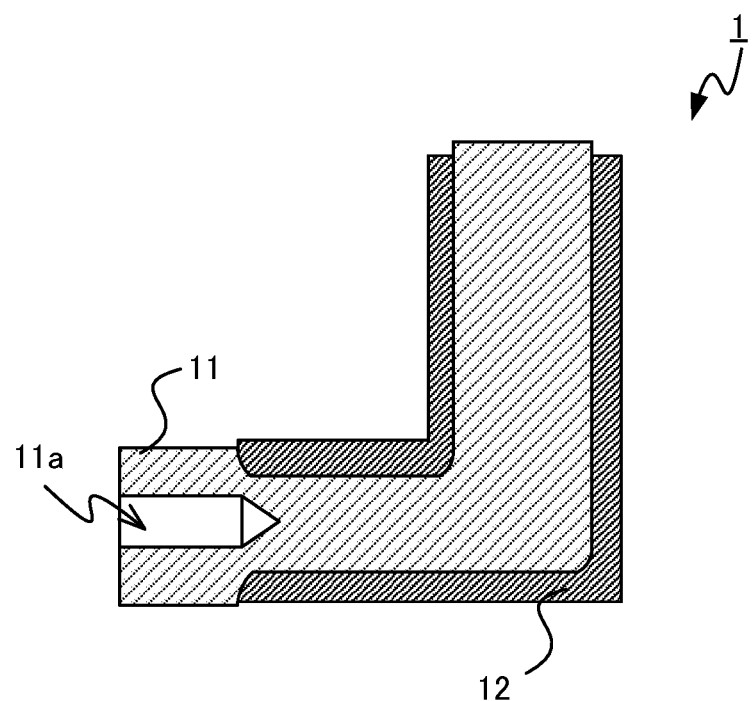
FIG. 7 is a cross-sectional view of the support insulator according to Embodiment 1 taken along the line A-A of FIG. 5.
Figure 8:
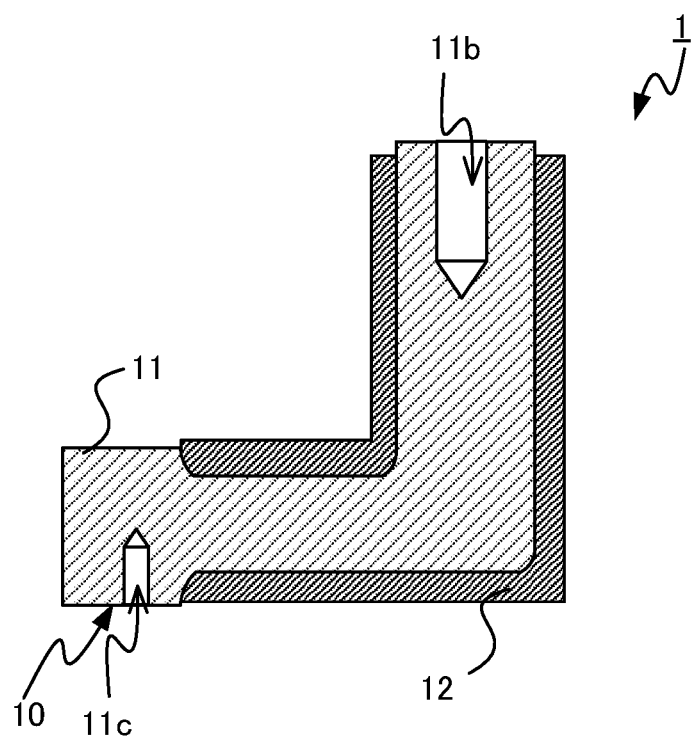
FIG. 8 is a cross-sectional view of the support insulator according to Embodiment 1 taken along the line B-B of FIG. 5.
Figure 9:
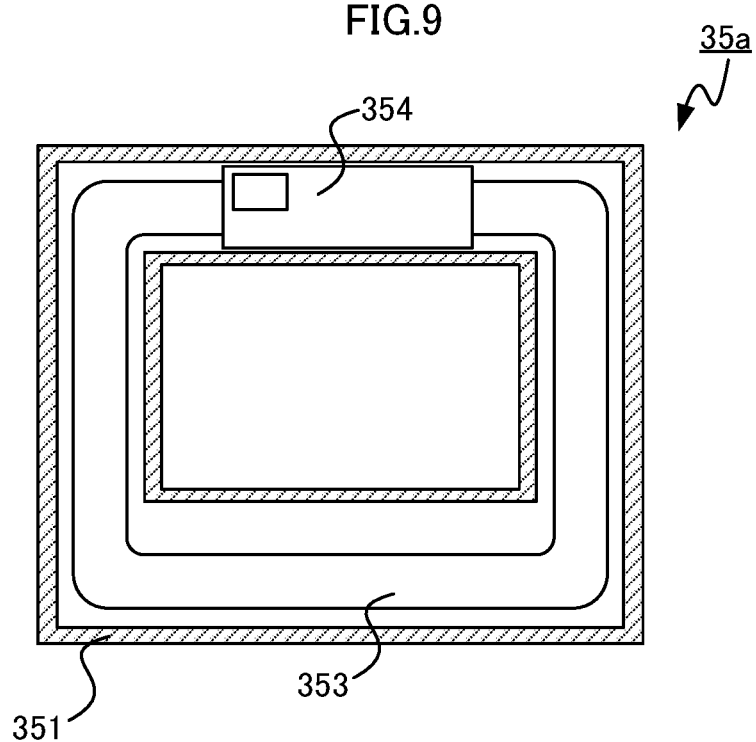
FIG. 9 is a cross-sectional view of the current sensor according to Embodiment 1.

In detail, as illustrated in FIGS. 5 and 6 and FIG. 7, which is a cross-sectional view taken along the line A-A of FIG. 5, the one end of the conductive member 11 has an insertion hole 11a for insertion of the fastening member 13. The insertion hole 11a extends from the one end of the conductive member 11 in the Y-axis direction. Furthermore, as illustrated in FIGS. 5 and 6 and FIG. 8, which is a cross-sectional view taken along the line B-B of FIG. 5, the one end of the conductive member 11 has an insertion hole 11c for insertion of the fastening member 16. The insertion hole 11c extends from the vertically lower surface of the conductive member 11 in the Z-axis direction. The other end of the conductive member 11 has an insertion hole 11b for insertion of the fastening member 14. The insertion hole 11b extends from the other end of the conductive member 11 in the Z-axis direction.

The insulating member 12 is made of an insulating material, such as synthetic resin. As illustrated in FIG. 2, the insulating member 12 is attached to a fixed frame 38 with fastening members 15. The fixed frame 38 is fixed to a housing 40 that accommodates the main circuit 33, as is described in detail below. The attachment of the insulating member 12 to the fixed frame 38 can thus achieve fixation of the support insulator 1 including the insulating member 12 to the housing 40.

The insulating member 12 is preferably made of a material having sufficient rigidity and strength such that at least the insulating member 12 is not deformed despite of maximum possible vibration of the vehicle in which the power conversion device 30 is installed.

In Embodiment 1, a part of the insulating member 12 has a columnar shape disposed over the segment of the conductive member 11 extending in the Y-axis direction. Another part of the insulating member 12 is disposed over the segment of the conductive member 11 extending in the Z-axis direction and has a shape that is polygonal when viewed in the Y axis direction.

In Embodiment 1, retaining members 17 are embedded in the end face of the insulating member 12 in the Y axis direction. The retaining members 17 have respective insertion holes 17a to for insertion of the fastening members 15. In detail, the retaining members 17 are embedded in the insulating member 12 with the openings of the insertion holes 17a exposed. The retaining members 17 are made of a material, such as metal, having sufficient rigidity and strength such that at least the retaining members 17 are not deformed despite of maximum possible vibration of the vehicle in which the power conversion device 30 is installed. The insulating member 12 is fixed to the fixed frame 38 with the fastening members 15 inserted into the respective insertion holes 17a, with the insulating member 12 contacting the fixed frame 38.

The insulating member 12 is disposed over the outer surface of the conductive member 11 to insulate the conductive member 11 and the busbars 36a and 37a connected to the conductive member 11 from the fixed frame 38. The support insulator 1 can therefore support the busbars 36a and 37a while insulating the busbars 36a and 37a from the housing 40.

The current sensor 35a is attached to the support insulator 1 having the above-described structure. The current sensor 35a is a current sensor of a current transformer (CT) type, for example. In detail, as illustrated in FIGS. 2 to 4 and 9, the current sensor 35a includes a case 351, an extension 352 extending from the case 351, a magnetic core 353, and a measurement circuit 354 to measure electric current based on a variation in magnetic flux generated in the magnetic core 353.

The case 351 has a ring shape defining a through hole at the center thereof. The ring shape means not only a circular ring shape but also a shape of polygon defining a through hole at the center thereof. The case 351 is made of an insulating material, such as synthetic resin.

The extension 352 extends from the case 351 in the direction in which the through hole of the case 351 extends, that is, in the Y-axis direction. The extension 352 has a through hole for insertion of the fastening member 16.

The magnetic core 353 has a ring shape defining a through hole at the center thereof. The magnetic flux in the magnetic core 353 varies in response to a current flow in the conductive member 11.

The measurement circuit 354 measures a value of current flowing in the conductive member 11, that is, a value of current flowing from the busbar 36a to the busbar 37a, based on a variation in magnetic flux in the magnetic core 353. The measurement circuit 354 then outputs a signal indicating the measured value via a terminal of the current sensor 35a, which is not illustrated, to the controller 51.

The current sensor 35a having the above-described configuration is attached to the attachment portion 10 of the support insulator 1 with the insulating member 12 disposed through the through hole disposed at the center of the case 351. In detail, the current sensor 35a is attached to the one end of the conductive member 11 with the fastening member 16, with the insulating member 12 disposed through the through hole disposed at the center of the case 351 and the extension 352 contacting the attachment portion 10. The fastening member 16 is inserted through the through hole of the extension 352 into the insertion hole 11c. Since the current sensor 35a is attached to the support insulator 1 as described above, the current sensor 35a receives smaller vibration in comparison to an existing current sensor attached to a busbar.

Figure 10:
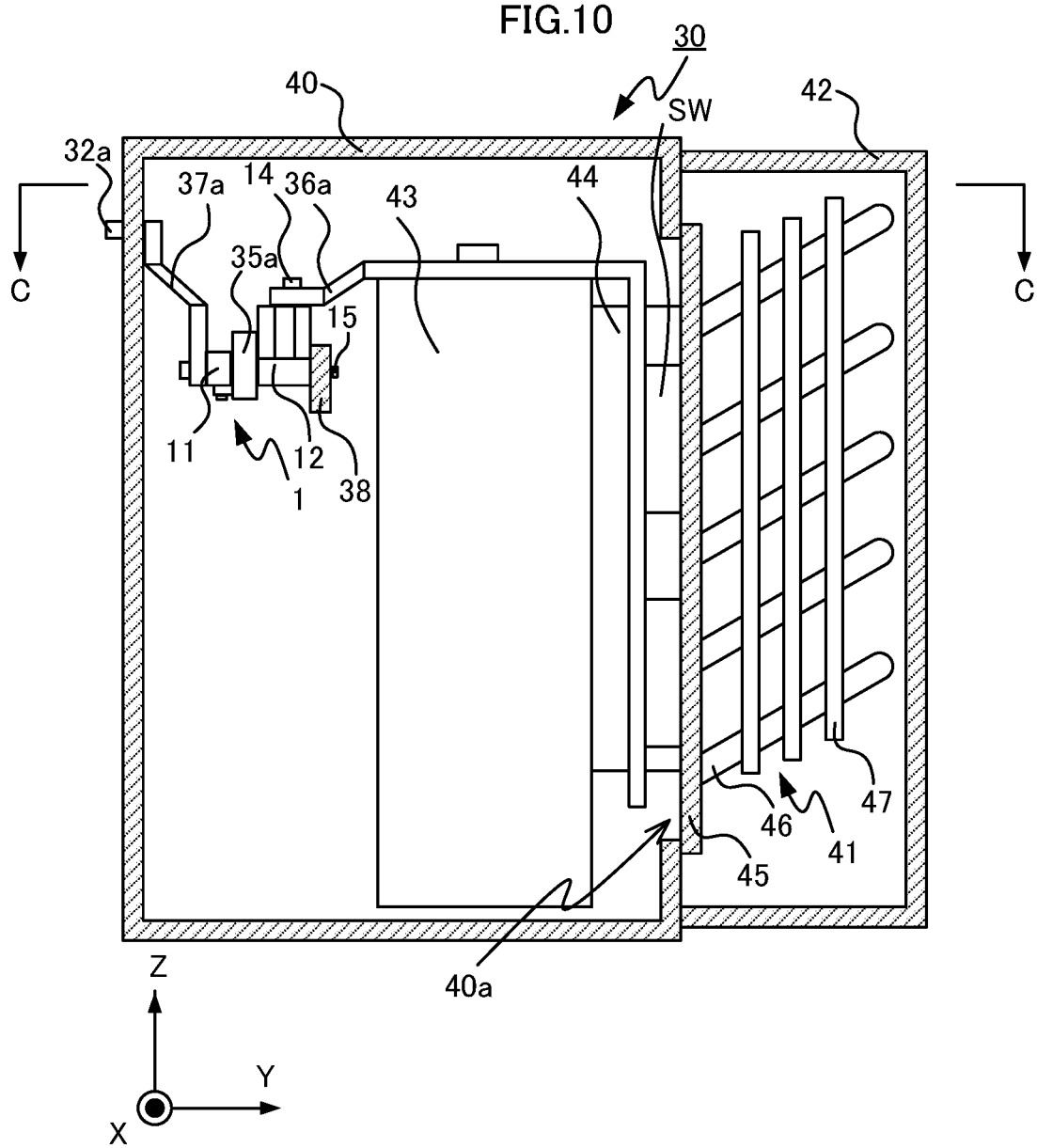
FIG. 10 is a cross-sectional view of the power conversion device according to Embodiment 1.
Figure 11:
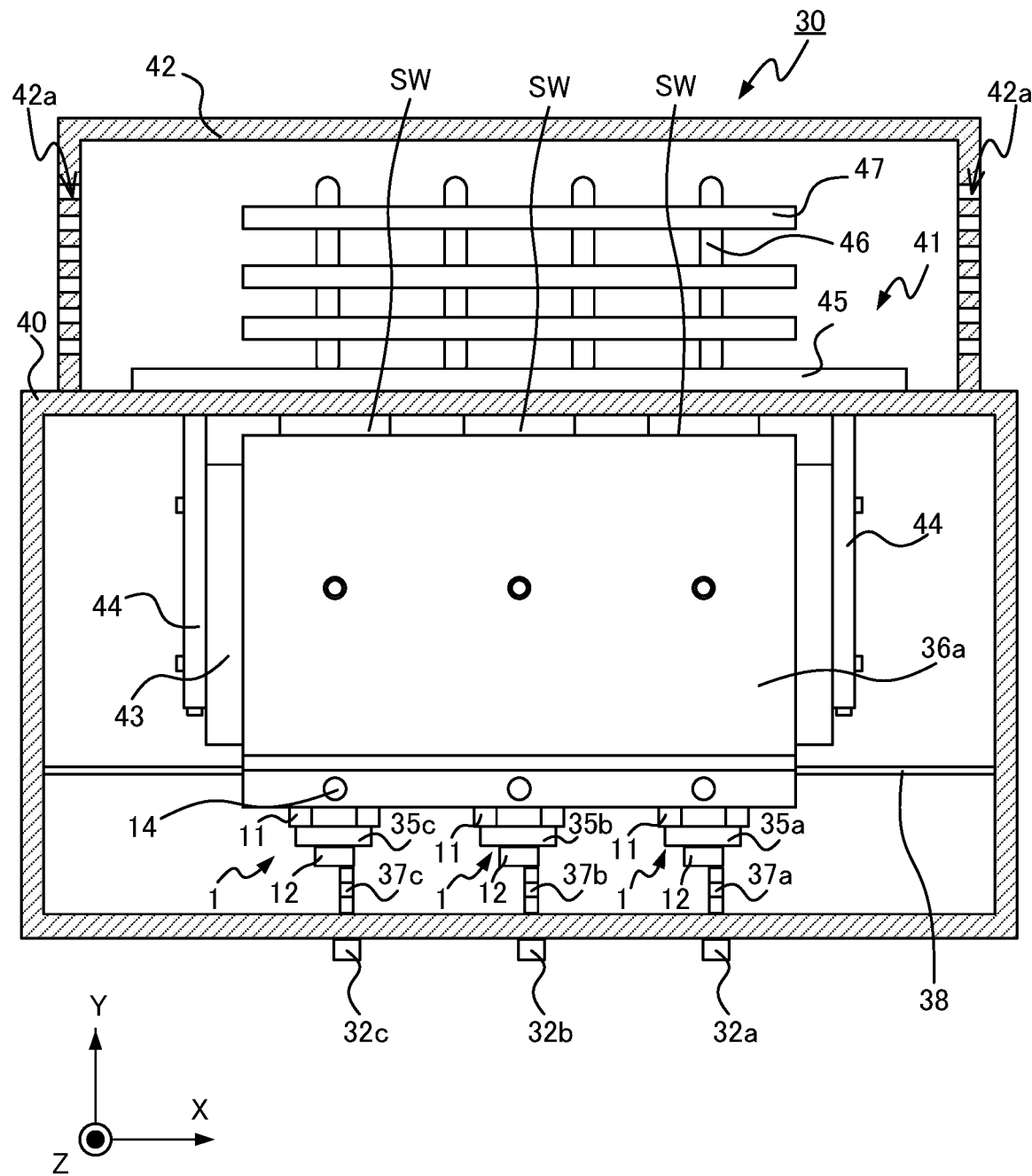
FIG. 11 is a cross-sectional view of the power conversion device according to Embodiment 1 taken along the line C-C of FIG. 10.

The support insulators 1 and the main circuit 33 are accommodated in the housing 40 of the power conversion device 30, as illustrated in FIG. 10 and FIG. 11, which is a cross-sectional view taken along the line C-C of FIG. 10. In detail, the power conversion device 30 includes the housing 40 to accommodate the support insulators 1 and the main circuit 33, a cooling device 41 installed in the housing 40 while closing an opening 40a of the housing 40, and a cover 42 disposed over the cooling device 41.

The housing 40 accommodates a capacitor unit 43 including the filter capacitor FC1, switching elements SW included in the power converter 34, the current sensors 35a, 35b, and 35c, the busbar 36a, the busbars 37a, 37b, and 37c respectively connected to the output terminals 32a, 32b, and 32c, and multiple support insulators 1 each supporting the busbar 36a and a corresponding busbar of the busbars 37a, 37b, and 37c while electrically connecting the busbar 36a and the corresponding busbar to each other. The housing 40 is also provided with the fixed frame 38 therein that has a main surface orthogonal to the Y axis and extends in the X-axis direction. The housing 40 is made of a material having sufficient rigidity and strength such that at least the housing 40 is not deformed despite of maximum possible vibration of the railway vehicle.

The switching elements SW are insulated gate bipolar transistors (IGBTs), for example, and are switched between on and off states in response to a signal output from the controller 51. The switching elements SW are mounted on a base 45, which is described below, included in the cooling device 41 and are cooled by the cooling device 41.

The current sensors 35a, 35b, and 35c are attached to the respective support insulators 1 attached to the fixed frame 38. Each of the current sensors 35a, 35b, and 35c measures a value of current flowing in the conductive member 11 of the support insulator 1 attached thereto, and then outputs a signal indicating the measured value to the controller 51.

The busbar 36a is fabricated by laminating insulating films and metal conductors on each other. In detail, the busbar 36a includes metal conductors to electrically connect the support insulators 1 to the respective switching elements SW, metal conductors to electrically connect the filter capacitor FC1 included in the capacitor unit 43 to the respective switching elements SW, and insulating films to insulate the metal conductors from each other.

The busbar 37a is a plate member made of an electrically conductive material, such as copper or aluminum. The busbar 37a connects, to the output terminal 32a, the conductive member 11 of the support insulator 1 with the current sensor 35a attached thereto.

The busbar 37b is a plate member made of an electrically conductive material, such as copper or aluminum. The busbar 37b connects, to the output terminal 32b, the conductive member 11 of the support insulator 1 with the current sensor 35b attached thereto.

The busbar 37c is a plate member made of an electrically conductive material, such as copper or aluminum. The busbar 37c connects, to the output terminal 32c, the conductive member 11 of the support insulator 1 with the current sensor 35c attached thereto.

Both ends of the fixed frame 38 are fixed on the surfaces of the housing 40 orthogonal to the X axis. The fixed frame 38 is a plate member that has a main surface orthogonal to the Y axis and extends in the X-axis direction. The fixed frame 38 is made of a material having sufficient rigidity and strength such that at least the fixed frame 38 is not deformed despite of maximum possible vibration of the railway vehicle, and rigidly fixed to the housing 40 such that at least the fixed frame 38 is not displaced despite of maximum possible vibration. The fixed frame 38 is preferably made of the material identical to the housing 40 and fixed to the housing 40 with fastening members made of the identical material, for example.

The cooling device 41 includes the base 45 mounted on the housing 40 while closing the opening 40a of the housing 40, multiple heat pipes 46 disposed on the base 45, and multiple fins 47 attached to the heat pipes 46. The switching elements SW are attached to the base 45 on the surface thereof that faces the inside of the housing 40. The heat pipes 46 each contain refrigerant.

When the energized switching elements SW generate heat, the heat is transferred via the base 45 and the heat pipes 46 to the refrigerant. The refrigerant that receives the heat is evaporated, and transfers the heat to the fins 47 via the heat pipes 46 while ascending inside the heat pipes 46. The heat received at the fins 47 is transferred via the fins 47 to the ambient air around the fins 47. The refrigerant that transfers the heat to the fins 47 is condensed into liquid, and descends inside the heat pipes 46. The refrigerant thus circulates inside the heat pipes 46 and thereby cools the switching elements SW.

The cover 42 has intake and exhaust ports 42a on the surfaces that face the side surfaces of the fins 47, specifically, on the two surfaces parallel to the YZ plane. The air entering through the intake and exhaust ports 42a flows between the fins 47, receives heat from the fins 47, and then exits through the intake and exhaust ports 42a. If the power conversion device 30 is installed in the vehicle such that the X-axis direction accords with the traveling direction of the vehicle, the cooling device 41 has improved cooling efficiency because of smooth flow of traveling winds between the fins 47.

The capacitor unit 43 is attached with fitting members 44 to the base 45 of the cooling device 41, which is described below and installed in the housing 40. The fitting members 44 are plate members having main surfaces parallel to the YZ plane.

In the power conversion device 30 having the above-described configuration, the current sensors 35a, 35b, and 35c accommodated in the housing 40 are attached to the respective support insulators 1 attached to the fixed frame 38. In other words, the current sensors 35a, 35b, and 35c are fixed to the housing 40 to which the fixed frame 38 is fixed.

As described above, the current sensors 35a, 35b, and 35c are attached to the respective support insulators 1. The current sensors 35a, 35b, and 35c therefore receive smaller vibration, in comparison to an existing current sensor attached to a busbar at a position distant from the fixed point of the busbar. This configuration can prevent the current sensors 35a, 35b, and 35c from malfunctioning due to vibration. In addition, a sensor having low vibration resistance can also be applied as the current sensors 35a, 35b, and 35c, thereby extending the flexibility of product design.

The insulating member 12 is located between the measurement circuit 354 included in each of the current sensors 35a, 35b, and 35c and the conductive member 11.

This structure can more certainly ensure an insulation distance required in the measurement circuit 354 of each of the current sensors 35a, 35b, and 35c, in comparison to that in an existing current sensor attached to a busbar. Accordingly, a sensor having low voltage resistance can also be applied as the current sensors 35a, 35b, and 35cthereby extending the flexibility of product design.

Embodiment 2

The support insulator 1 may have any structure and any shape that enable reduction of vibration received at an electronic component attached to the support insulator 1. The description of Embodiment 2 is directed to a support insulator 2 having a shape different from that in Embodiment 1.

Figure 12:
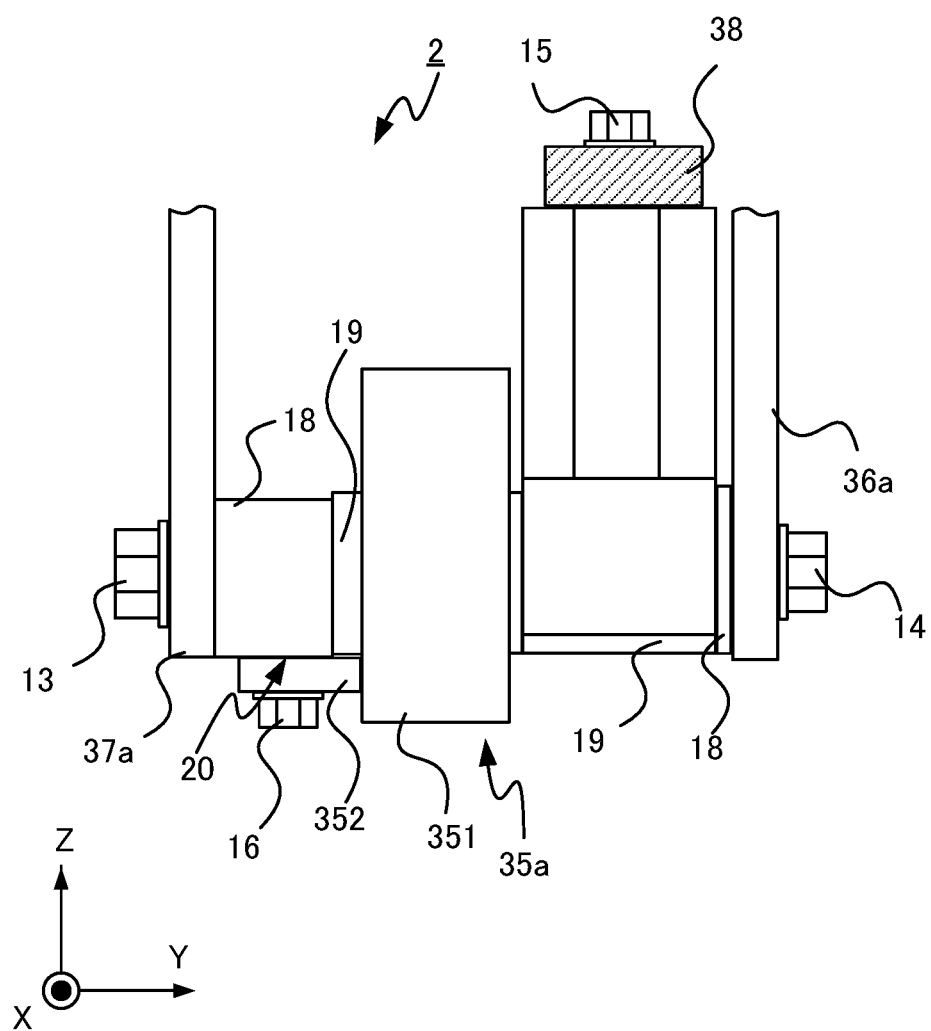
FIG. 12 is a side view illustrating an exemplary manner of fixation of a current sensor to a support insulator according to Embodiment 2.
Figure 13:
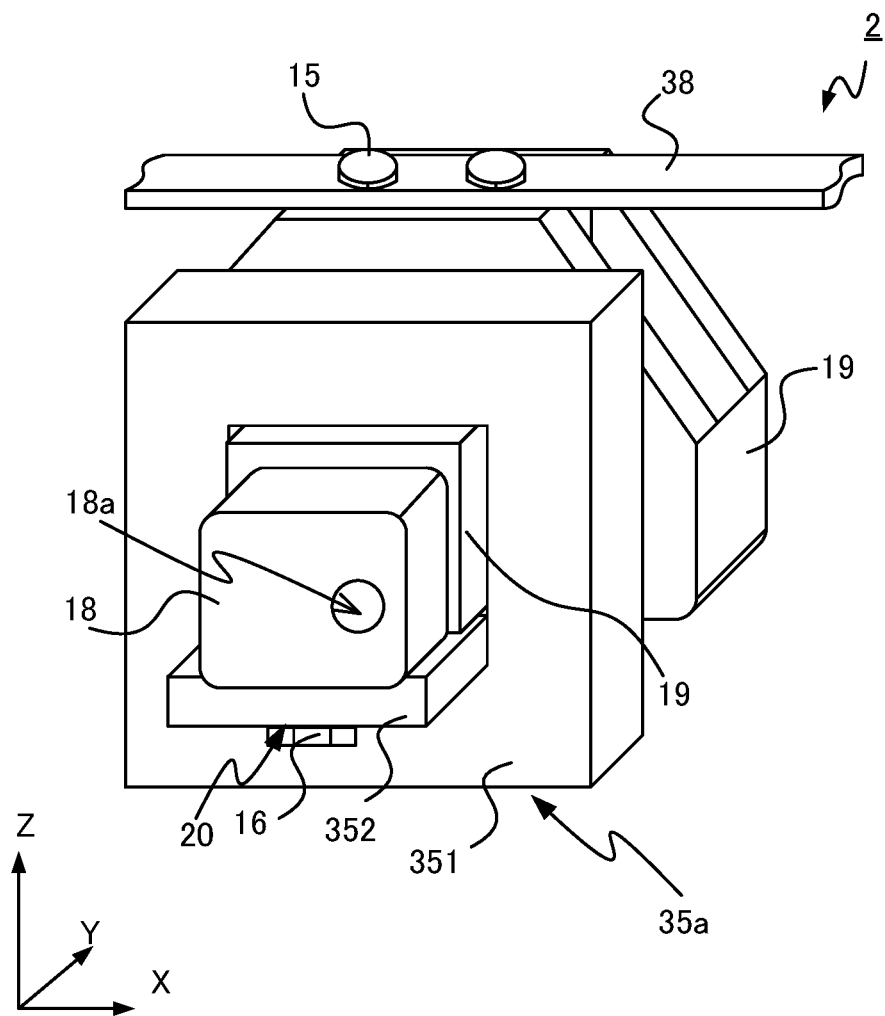
FIG. 13 is a perspective view illustrating an exemplary manner of fixation of the current sensor to the support insulator according to Embodiment 2.
Figure 14:
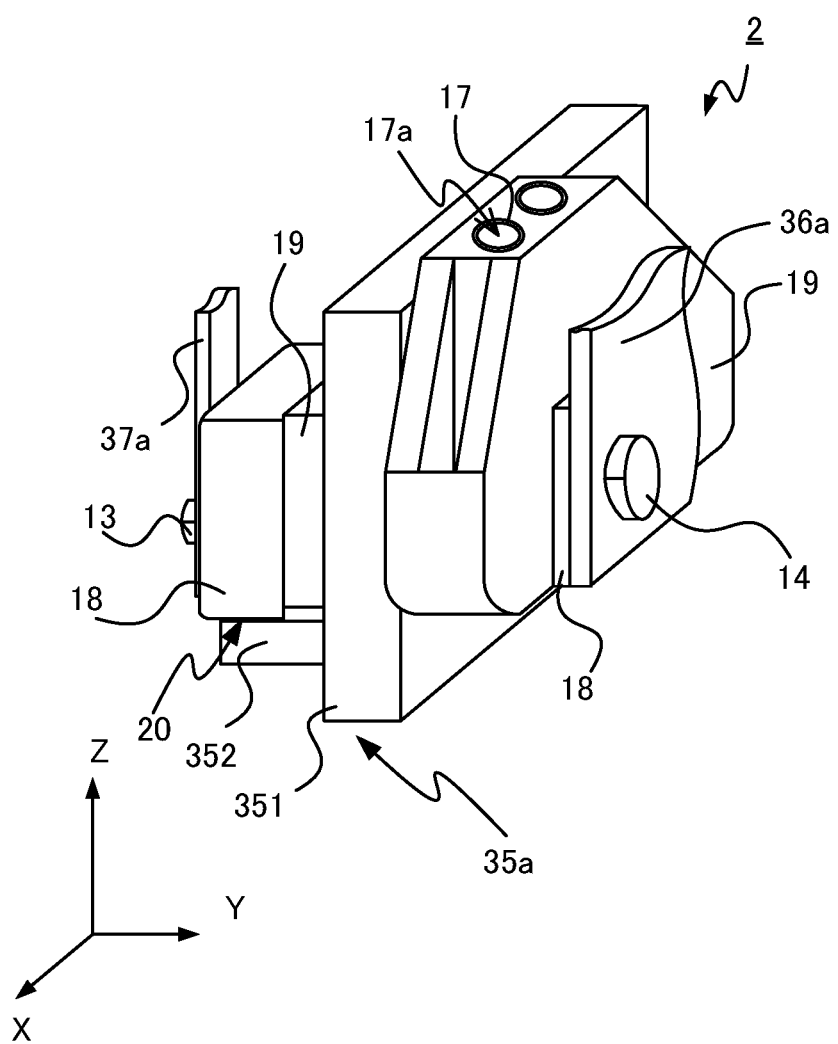
FIG. 14 is another perspective view illustrating an exemplary manner of fixation of the current sensor to the support insulator according to Embodiment 2.

As illustrated in FIGS. 12 to 14, the support insulator 2 supports the busbar 36a connected to the power converter 34 and the busbar 37a connected to the output terminal 32a while electrically connecting these busbars to each other. FIG. 13 does not illustrate the busbar 36a or 37a in order to simplify the figure.

The support insulator 2 includes a conductive member 18 to which the busbar 36a and the busbar 37a are attachable and that electrically connects the busbar 36a and the busbar 37a to each other, and an insulating member 19 disposed over the outer surface of the conductive member 18.

The conductive member 18 is made of an electrically conductive material, such as copper. The conductive member 18 has a columnar shape extending in the Y-axis direction. The insulating member 19 is disposed over the outer surface of the conductive member 18 with both ends of the conductive member 18 exposed.

The busbar 37a is fixed to one end of the conductive member 18 with the fastening member 13. Additionally, the current sensor 35a is fixed to the one end of the conductive member 18 with the fastening member 16. In other words, the one end of the conductive member 18 constitutes an attachment portion 20 to which the current sensor 35a is attachable.

The busbar 36a is fixed to the other end of the conductive member 18 with the fastening member 14.

Figure 15:
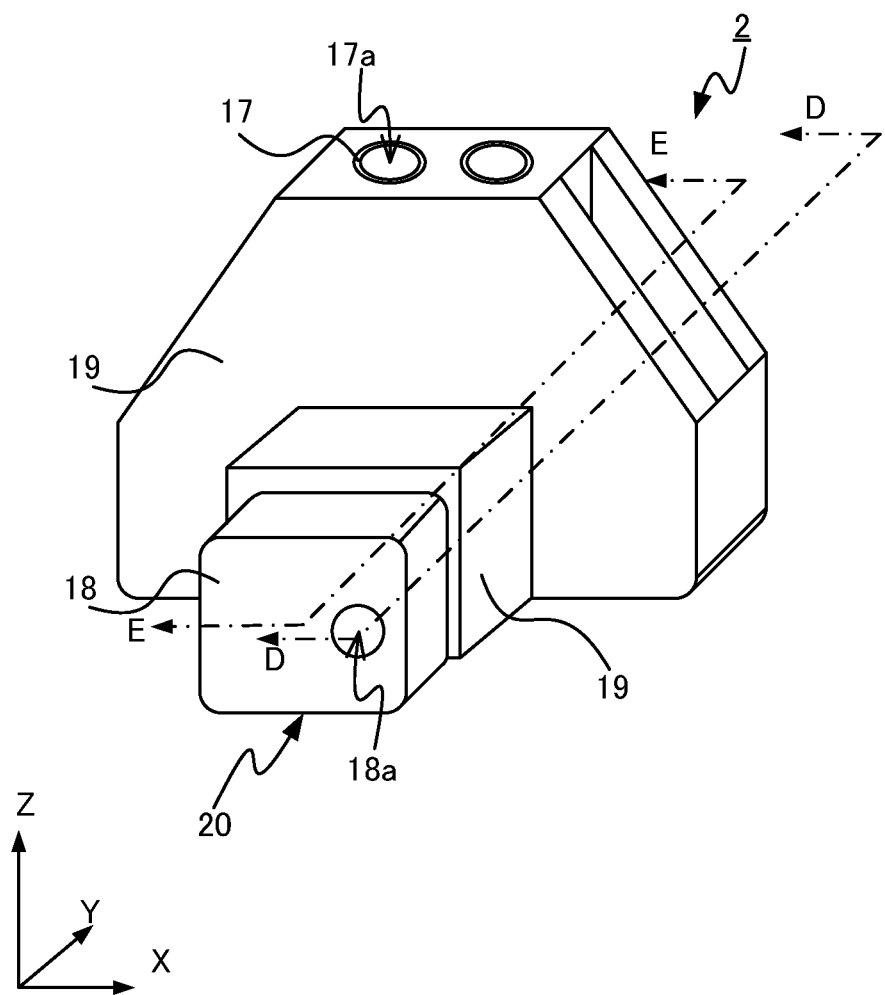
FIG. 15 is a perspective view of the support insulator according to Embodiment 2.
Figure 16:
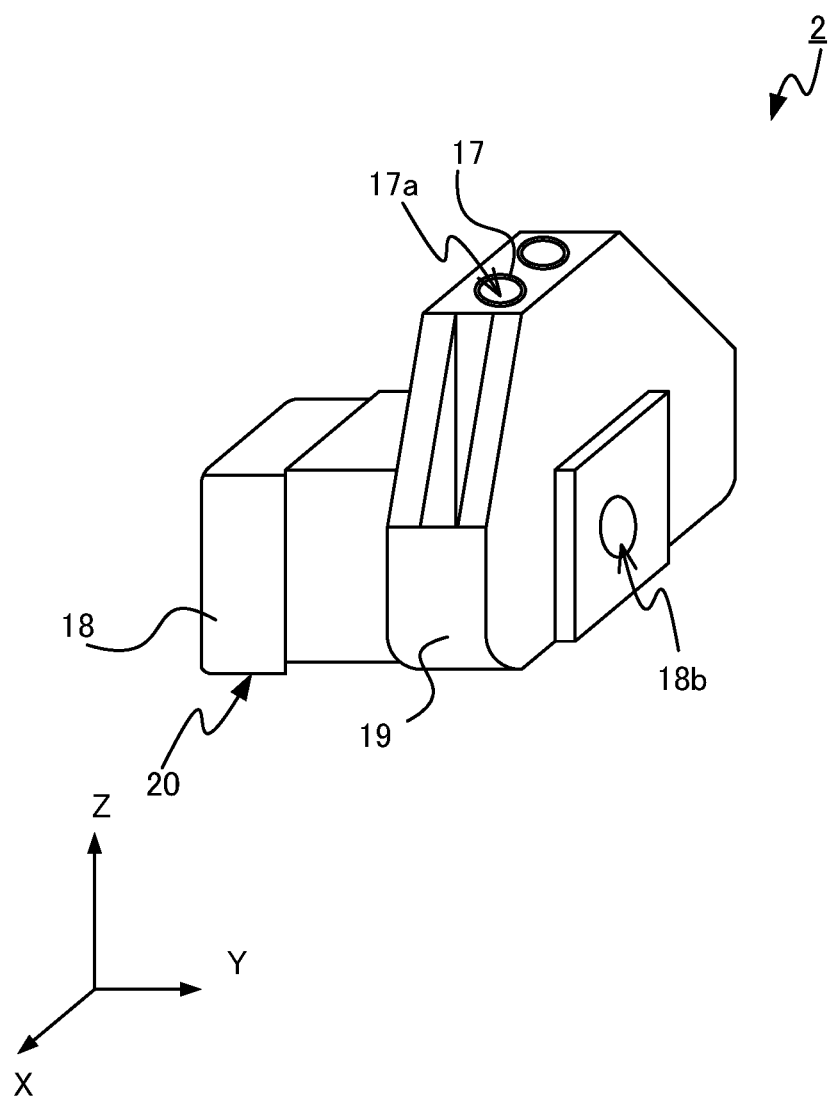
FIG. 16 is another perspective view of the support insulator according to Embodiment 2.
Figure 17:
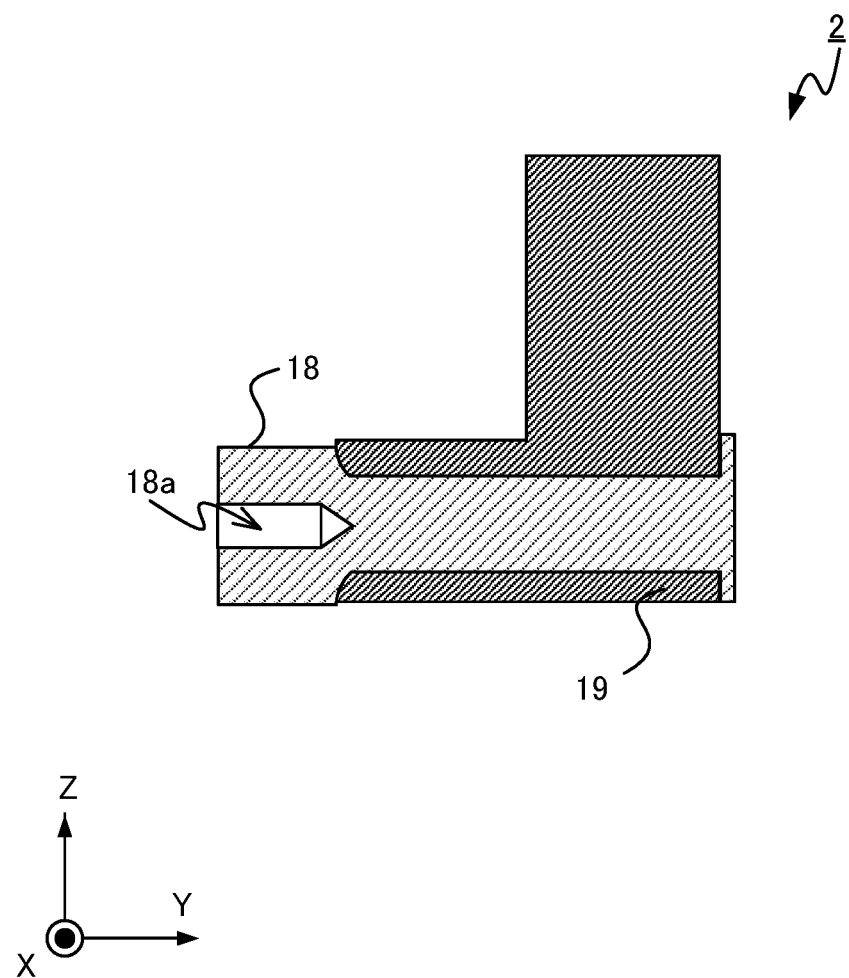
FIG. 17 is a cross-sectional view of the support insulator according to Embodiment 2 taken along the line D-D of FIG. 15.
Figure 18:
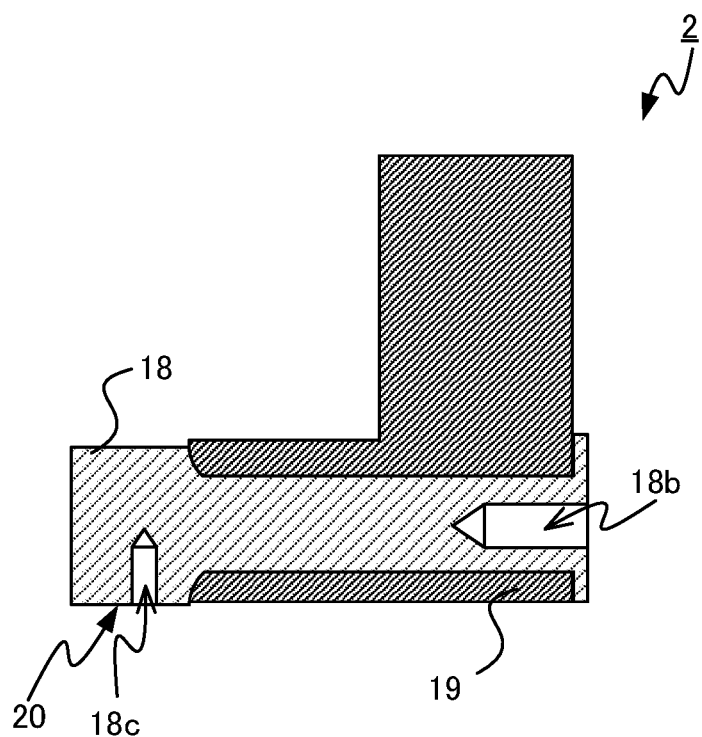
FIG. 18 is a cross-sectional view of the support insulator according to Embodiment 2 taken along the line E-E of FIG. 15.

In detail, as illustrated in FIGS. 15 and 16 and FIG. 17, which is a cross-sectional view taken along the line D-D of FIG. 15, the one end of the conductive member 18 has an insertion hole 18a for insertion of the fastening member 13. The insertion hole 18a extends from the one end of the conductive member 18 in the Y-axis direction. Furthermore, as illustrated in FIGS. 15 and 16 and FIG. 18, which is a cross-sectional view taken along the line E-E of FIG. 15, the one end of the conductive member 18 has an insertion hole 18c for insertion of the fastening member 16. The insertion hole 18c extends from the vertically lower surface of the conductive member 18 in the Z-axis direction. The other end of the conductive member 18 has an insertion hole 18b for insertion of the fastening member 14. The insertion hole 18b extends from the other end of the conductive member 18 in the Y-axis direction.

The insulating member 19 is made of an insulating material, such as synthetic resin. As illustrated in FIGS. 12 and 13, the insulating member 19 is attached to the fixed frame 38 fixed to the housing 40, with the fastening members 15. This structure can thus achieve fixation of the support insulator 2 to the housing 40.

In Embodiment 2, the retaining members 17 are embedded in the vertically upper surface of the insulating member 19. The retaining members 17 have the respective insertion holes 17a for insertion of the fastening members 15. In detail, the retaining members 17 are embedded in the insulating member 19 with the openings of the insertion holes 17a exposed. The insulating member 19 is fixed to the fixed frame 38 with the fastening members 15 inserted into the respective insertion holes 17a, with the insulating member 19 contacting the fixed frame 38.

The insulating member 19 is disposed over the outer surface of the conductive member 18 and to insulate the conductive member 18 and the busbars 36a and 37a connected to the conductive member 18 from the fixed frame 38. The support insulator 2 can therefore support the busbars 36a and 37a while insulating the busbars 36a and 37a from the housing 40.

The current sensor 35a of a CT type is attached to the support insulator 2 having the above-described structure. Specifically, the current sensor 35a is attached to the attachment portion 20 of the support insulator 2 with the insulating member 19 disposed through the through hole disposed at the center of the case 351. In detail, as in FIGS. 12 to 14, the current sensor 35a is attached to the one end of the conductive member 18 with the fastening member 16, with the insulating member 19 disposed through the through hole disposed at the center of the case 351 and the extension 352 contacting the attachment portion 20. The fastening member 16 is inserted through the through hole of the extension 352 into the insertion hole 18c. Since the current sensor 35a is attached to the support insulator 2 as described above, the current sensor 35a receives smaller vibration in comparison to an existing current sensor attached to a busbar.

Figure 19:
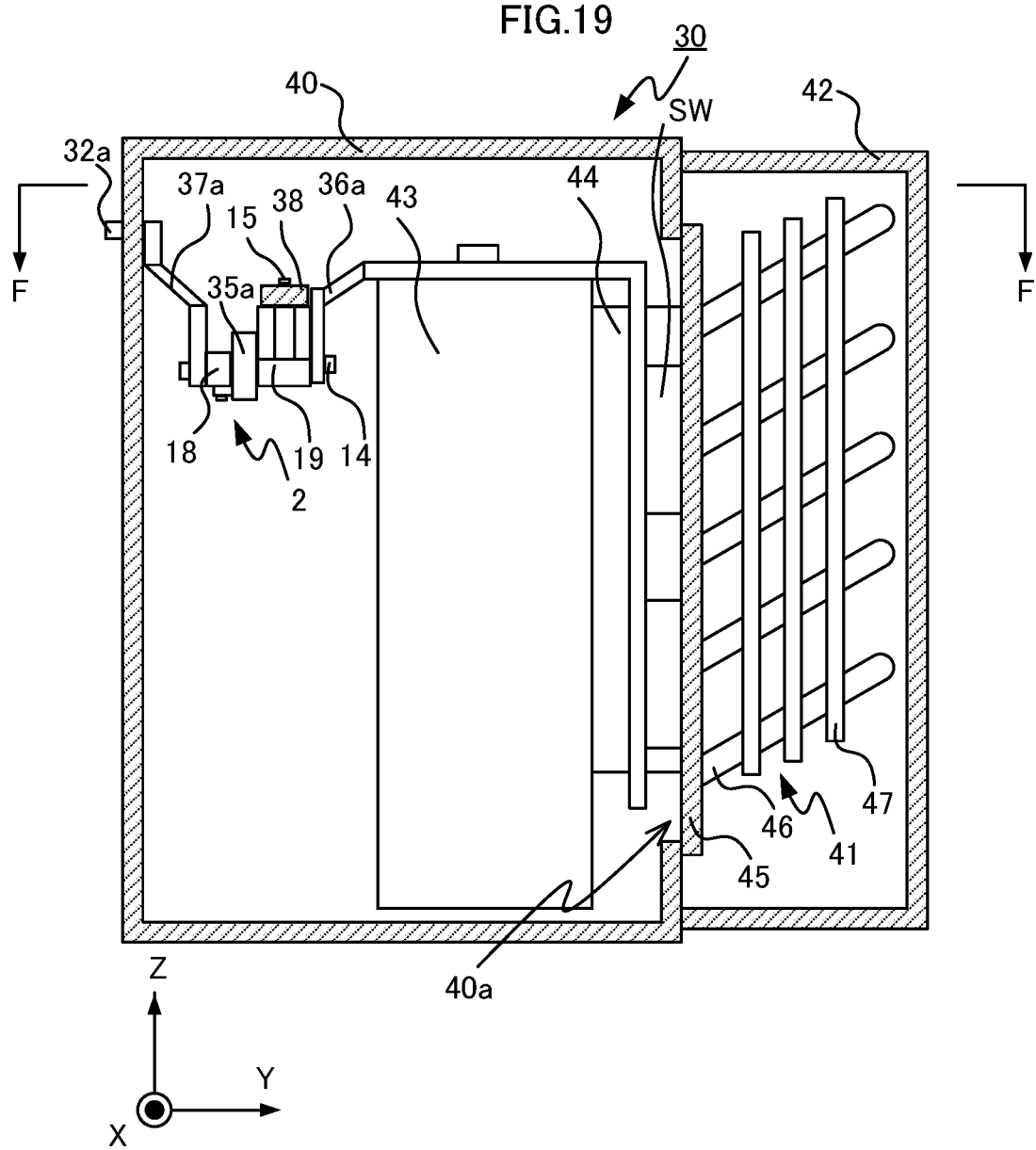
FIG. 19 is a cross-sectional view of a power conversion device according to Embodiment 2.
Figure 20:
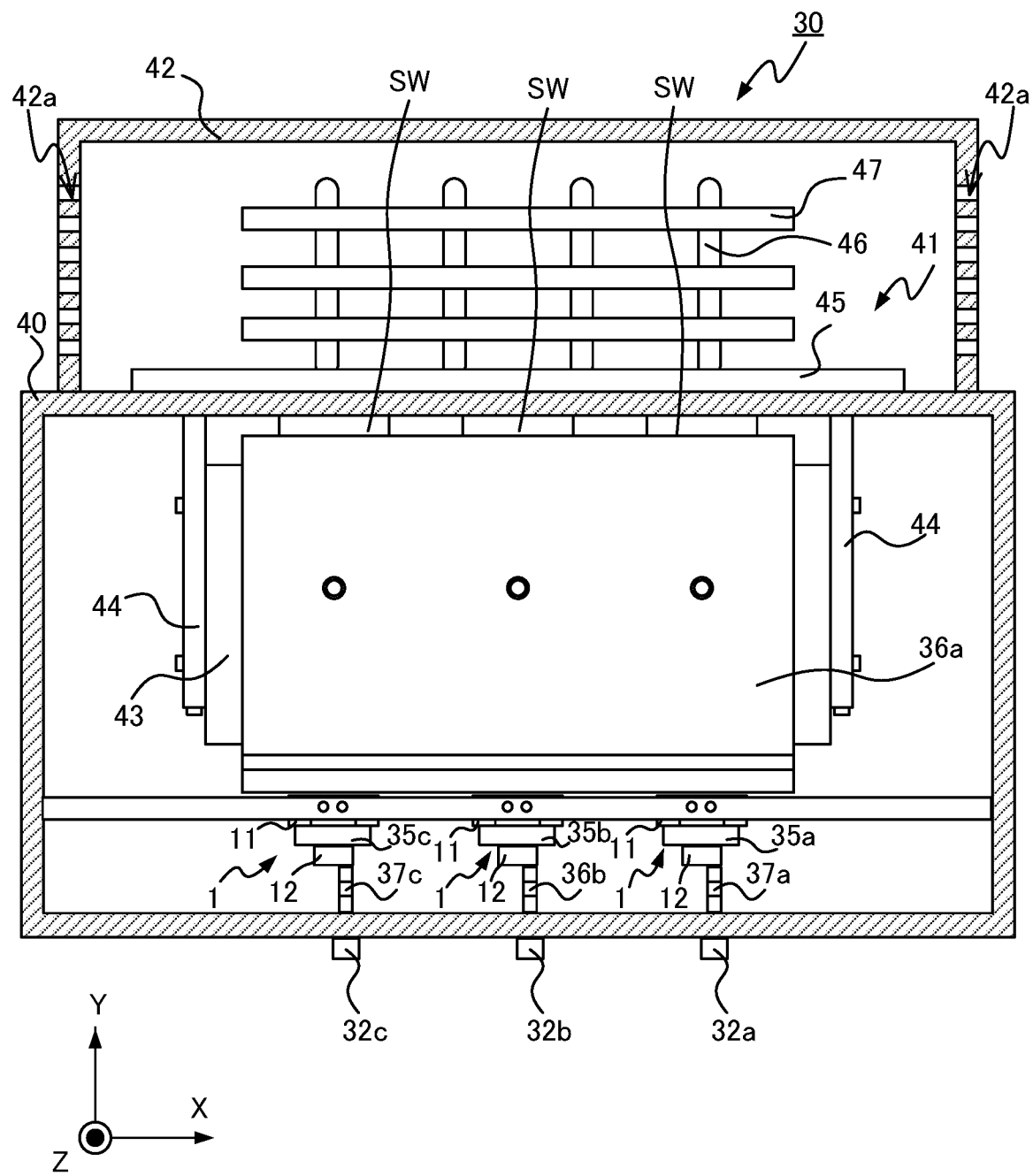
FIG. 20 is a cross-sectional view of the power conversion device according to Embodiment 2 taken along the line F-F of FIG. 19.

The support insulators 2 and the main circuit 33 are accommodated in the housing 40 of the power conversion device 30, as illustrated in FIG. 19 and FIG. 20, which is a cross-sectional view taken along the line F-F of FIG. 19. Unlike the power conversion device 30 according to Embodiment 1, the housing 40 is provided with the fixed frame 38 therein that has a main surface orthogonal to the Z axis and extends in the X-axis direction. In the power conversion device 30, the current sensors 35a, 35b, and 35c accommodated in the housing 40 are attached to the respective support insulators 2 attached to the fixed frame 38. In other words, the current sensors 35a, 35b, and 35c are fixed to the housing 40 to which the fixed frame 38 is fixed.

As described above, the current sensors 35a, 35b, and 35c are attached to the respective support insulators 2. The current sensors 35a, 35b, and 35c therefore receive smaller vibration, in comparison to an existing current sensor attached to a busbar at a position distant from the fixed point of the busbar. This configuration can prevent the current sensors 35a, 35b, and 35c from malfunctioning due to vibration. In addition, a sensor having low vibration resistance can also be applied as the current sensors 35a, 35b, and 35c, thereby extending the flexibility of product design.

The insulating member 19 is located between the measurement circuit 354 included in each of the current sensors 35a, 35b, and 35c and the conductive member 18. This structure can more certainly ensure an insulation distance of each of the current sensors 35a, 35b, and 35c, in comparison to that in an existing current sensor attached to a busbar. Accordingly, a sensor having low voltage resistance can also be applied as the current sensors 35a, 35b, and 35c, thereby extending the flexibility of product design.

The conductive member 18 having a columnar shape extending in one direction can be manufactured by a less complicated process with reduced costs.

The above-described embodiments are not to be construed as limiting the present disclosure.

Figure 21:
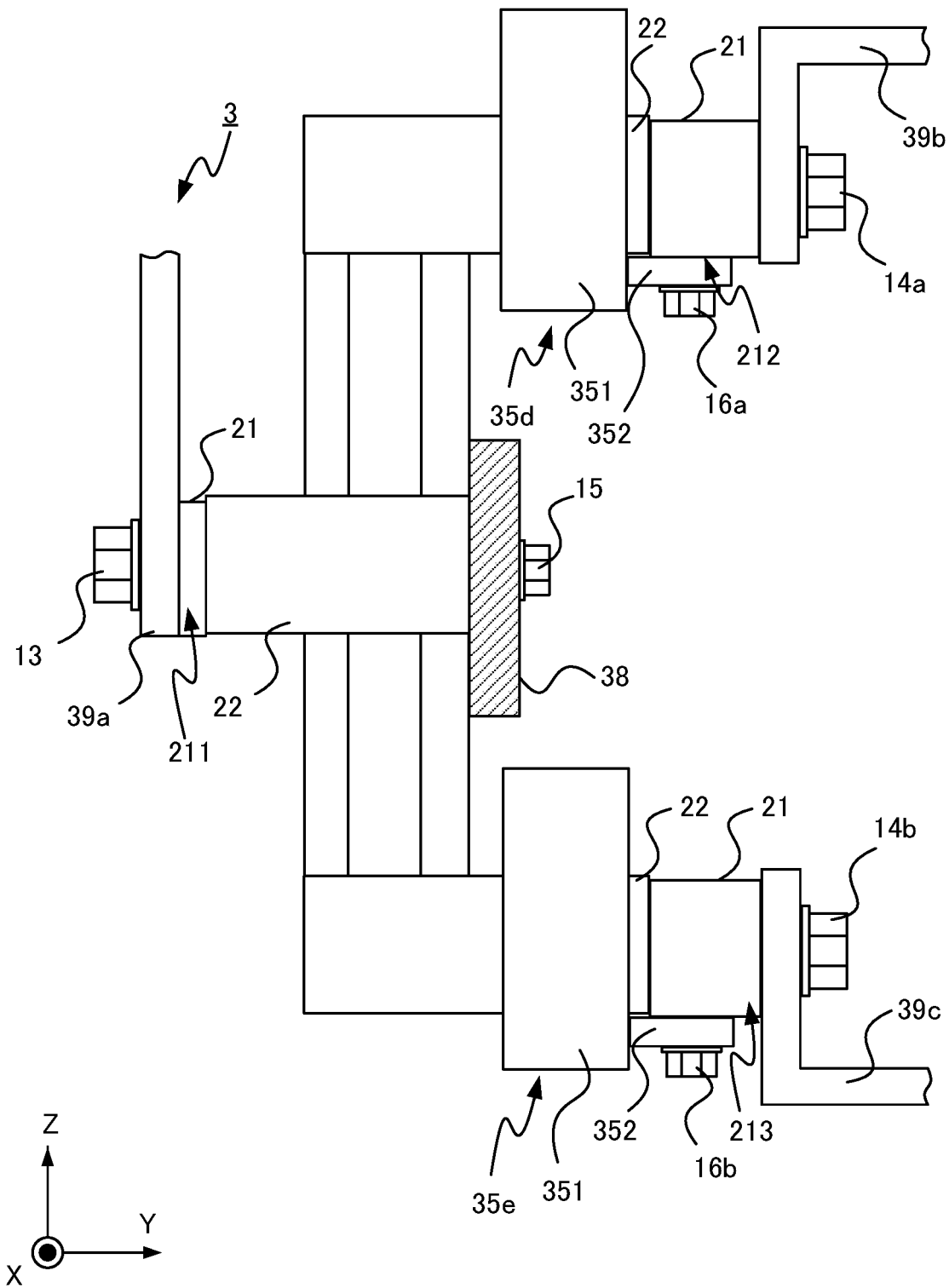
FIG. 21 is a side view illustrating an exemplary manner of fixation of a current sensor to a support insulator according to a modification of the embodiments.
Figure 22:
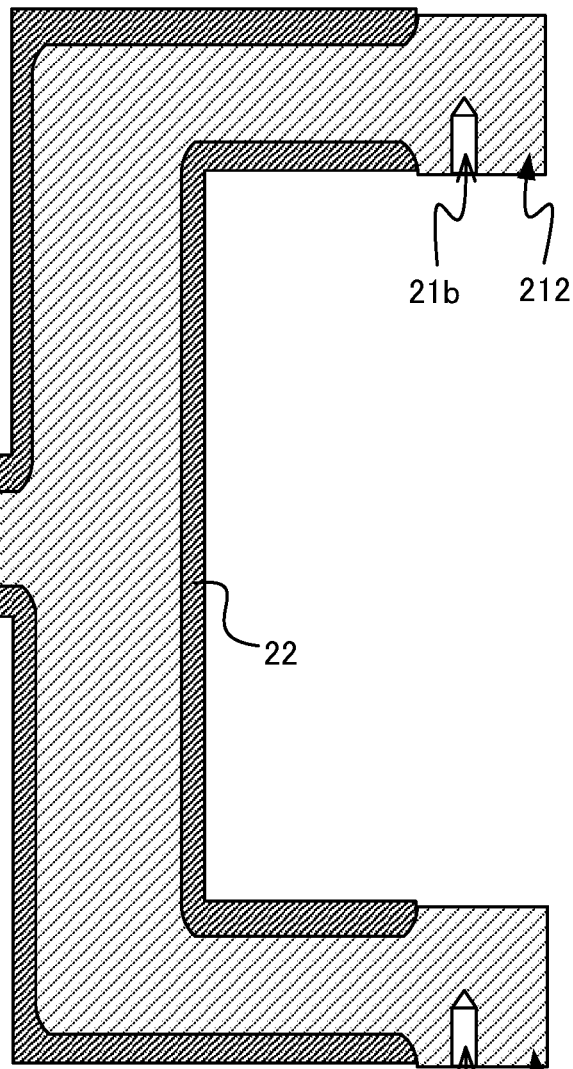
FIG. 22 is a cross-sectional view of the support insulator according to the modification of the embodiments.

Although the support insulator 1 supports the two busbars 36a and 37a, the support insulator may support any number of busbars. FIGS. 21 to 23 illustrate an exemplary support insulator 3 to support three busbars while electrically connecting these busbars to each other. Busbars 39a, 39b, and 39c are attached to the support insulator 3. The support insulator 3 is described below focusing on an example in which current from the busbar 39a flows through the support insulator 3 to each of the busbars 39b and 39c.

The support insulator 3 includes a conductive member 21 to electrically connect the busbars 39a, 39b, and 39c to each other and an insulating member 22 disposed over the outer surface of the conductive member 21.

The conductive member 21 is made of an electrically conductive material, such as copper. The conductive member 21 has a branch. In detail, the conductive member 21 extends from an end 211 and branches into two segments having respective ends 212 and 213. The insulating member 22 is disposed over the outer surface of the conductive member 21 with the ends 211, 212, and 213 of the conductive member 21 exposed. The busbar 39a is fixed to the end 211 with the fastening member 13.

The busbar 39b is fixed to the end 212 with a fastening member 14a. Additionally, a current sensor 35d is fixed to the end 212. In other words, the end 212 serves as an attachment portion to which an electronic component is attachable. The current sensor 35d has the structure identical to those of the current sensors 35a, 35b, and 35c.

The busbar 39c is fixed to the end 213 with a fastening member 14b. Additionally, a current sensor 35e is fixed to the end 213. In other words, the end 213 serves as an attachment portion to which an electronic component is attachable. The current sensor 35e has the structure identical to those of the current sensors 35a, 35b, and 35c.

In detail, as illustrated in FIG. 22, which is a cross-sectional view of the support insulator 3 illustrated in FIG. 21 taken along a YZ plane, the end 211 has an insertion hole 21a for insertion of the fastening member 13. The end 212 has an insertion hole 21b for insertion of a fastening member 16a. The end 213 has an insertion hole 21c to for insertion of a fastening member 16b.

As illustrated in FIG. 23, which is another cross-sectional view taken along a YZ plane different from that in FIG. 22, the end 212 has an insertion hole 21d for insertion of the fastening member 14a. The end 213 has an insertion hole 21e for insertion of the fastening member 14b.

The conductive members 11, 18, and 21 may have any shape that enables electrically connecting the busbars 36a and 37a to each other or that enables electrically connecting the busbars 39a, 39b, and 39c to one another. For example, the conductive member 11 may have a shape bent at any angle. For another example, the conductive member 11 may have a shape bent at multiple sites. The section of each of the conductive members 11, 18, and 21 orthogonal to the extending direction is not necessarily rectangular and may also be any shape, such as circle, ellipse, or rectangle with rounded corners.

Each of the insertion holes 11a, 11b, and 11c provided in the conductive member 11 may be disposed at any position and extend in any direction that enable attachment of the busbars 36a and 37a and the current sensor 35a. For example, the insertion holes 11a, 11b, and 11c may all extend in the Z-axis direction. In this case, the busbar 37a may be attached to the conductive member 11 with the fastening member 13, with the busbar 37a contacting the vertically upper surface of the one end of the conductive member 11. For another example, the insertion hole 11b may extend in the Y-axis direction. In this case, the busbar 36a may be attached to the conductive member 11 with the fastening member 14, with the busbar 36a facing and contacting the other end of the conductive member 11 in the Y-axis direction.

The insulating members 12, 19, and 22 may have any shape provided that the insulating members 12, 19, and 22 can be attached to the fixed frame 38 and can insulate the conductive members 11, 18, and 21 from the fixed frame 38. For example, the insulating member 12 may have a columnar shape bent at an angle of 90°, like the conductive member 11. For another example, the insulating member 12 may be disposed over the side surface of the conductive member 11 while exposing only both end faces of the conductive member 11 orthogonal to the extending directions.

The current sensors 35a, 35b, and 35c may be attached to the support insulator 1 or 2 by any procedure provided that the current sensors 35a, 35b, and 35c can be rigidly fixed such that at least the current sensors 35a, 35b, and 35c are not displaced relative to the support insulator 1 or 2 despite of maximum possible vibration of the railway vehicle.

For example, the current sensor 35a may be fixed to the support insulator 1 by embedding a retaining member 17 in the insulating member 12, and inserting and fastening the fastening member 16 into the retaining member 17. In this case, the part of the insulating member 12 in which the retaining member 17 is embedded constitutes the attachment portion 10 to which an electronic component is attachable.

For another example, the current sensor 35a may be bonded to the insulating member 12 with an adhesive. Specifically, the current sensor 35a may be bonded to the insulating member 12 with any of the surfaces of the current sensor 35a surrounding the through hole of the case 351 being in contact with the insulating member 12. In this case, the part of the insulating member 12 contacting the case 351 constitutes the attachment portion 10 to which an electronic component is attachable. The current sensor 35a in this case does not necessarily include the extension 352.

For another example, the current sensor 35a may be fixed to the support insulator 1 by disposing in the insulating member 12 an insertion hole for insertion of the fastening member 16, and inserting and fastening the fastening member 16 into this insertion hole. In this case, the part of the insulating member 12 having the insertion hole constitutes the attachment portion 10 to which an electronic component is attachable.

Although the fixed frame 38 is fabricated independently from the housing 40 in the above-described embodiments, the fixed frame 38 may also be fabricated integrally with the housing 40. In other words, the support insulators 1 to 3 may be attached directly to the housing 40. The direct attachment to the housing 40 can achieve reduction of vibration received at the current sensors 35a, 35b, 35c, 35d, and 35e.

The fixed frame 38 may be any member, any electronic component, or the like fixed to the housing 40. For example, a case of the capacitor unit 43 may serve as the fixed frame 38. In this case, the support insulators 1 to 3 are attached to the case of the capacitor unit 43.

The support insulators 1 to 3 may also be attached to multiple fixed frames 38. For example, the vertically upper and lower surfaces of the insulating member 19 of the support insulator 2 may be attached to the respective fixed frames 38. In this case, the power conversion device 30 includes the two fixed frames 38 extending in the X-axis direction inside the housing 40.

The current sensors 35a, 35b, 35c, 35d, and 35e are not necessarily a sensor of a CT type. The current sensors 35a, 35b, 35c, 35d, and 35e may also be any current sensor, such as Hall element sensor or Rogowski coil sensor.

The electronic components fixed to the support insulators 1 to 3 are not necessarily the current sensors 35a, 35b, 35c, 35d, and 35e, and may be any electronic component included in the main circuit 33. For example, voltage sensors may be fixed to the support insulators 1 to 3.

The support insulators 1 to 3 can support any busbars included in the main circuit 33 while electrically connecting these busbars to each other. For example, the support insulators 1 to 3 may support a busbar connected to the positive input terminal 31a and a busbar connected to one end of the filter capacitor FC1 and electrically connect these busbars to each other.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3 Support insulator
10, 20 Attachment portion
11, 18, 21 Conductive member
11a, 11b, 11c, 17a, 18a, 18b, 18c, 21a, 21b, 21c, 21d, 21e Insertion hole
12, 19, 22 Insulating member
13, 14, 14a, 14b, 15, 16, 16a, 16b Fastening member
17 Retaining member
30 Power conversion device
31a Positive input terminal
31b Negative input terminal
32a, 32b, 32c Output terminal
33 Main circuit
34 Power converter
35a, 35b, 35c, 35d, 35e Current sensor
36a, 37a, 37b, 37c, 39a, 39b, 39c Busbar
38 Fixed frame
40 Housing
40a Opening
41 Cooling device
42 Cover
42a Intake and exhaust port
43 Capacitor unit
44 Fitting member
45 Base
46 Heat pipe
47 Fin
51 Controller
61 Load
211, 212, 213 End 351 Case
352 Extension
353 Magnetic core
354 Measurement circuit
FC1 Filter capacitor
SW Switching element

The invention claimed is:

1. A support insulator to support a plurality of busbars included in a main circuit, the support insulator comprising:
a conductive member to which the busbars are attachable, the conductive member being configured to electrically connect the busbars to each other; and
an insulating member attachable to a fixed frame fixed to a housing for accommodating the main circuit, the insulating member being disposed over an outer surface of the conductive member to insulate the conductive member and the busbars from the fixed frame,
wherein an electronic component included in the main circuit is attachable to an end of the conductive member.

2. The support insulator according to claim 1, wherein the insulating member is disposed over the outer surface of the conductive member with both ends of the conductive member exposed,
one end of the exposed ends of the conductive member has an insertion hole for insertion of a fastening member, and
the electronic component is attachable to the one end having the insertion hole with the fastening member for insertion to the insertion hole.

3. A support insulator to support a plurality of busbars included in a main circuit, the support insulator comprising:
a conductive member to which the busbars are attachable, the conductive member being configured to electrically connect the busbars to each other;
an insulating member attachable to a fixed frame fixed to a housing for accommodating the main circuit, the insulating member being disposed over an outer surface of the conductive member to insulate the conductive member and the busbars from the fixed frame; and
an attachment portion to which an electronic component included in the main circuit is attachable.

4. The support insulator according to claim 3, wherein a part of the insulating member has an insertion hole for insertion of a fastening member,
the part of the insulating member having the insertion hole constitutes the attachment portion, and
the electronic component is attachable to the attachment portion with the fastening member for insertion to the insertion hole.

5. The support insulator according to claim 3, further comprising a retaining member having an insertion hole for insertion of a fastening member, the retaining member being embedded in the insulating member with an opening of the insertion hole exposed, wherein
the retaining member constitutes the attachment portion, and
the electronic component is attachable to the attachment portion with the fastening member for insertion to the insertion hole.

6. The support insulator according to claim 1, wherein the electronic component is a current sensor to measure electric current flowing in the busbars.

7. The support insulator according to claim 3, wherein the electronic component attachable to the attachment portion is a current sensor to measure electric current flowing in the busbars.

8. The support insulator according to claim 6, wherein
the current sensor that is the electronic component includes
a ring-shaped magnetic core,
a measurement circuit to measure the electric current based on a variation in magnetic flux generated in the magnetic core, and
a ring-shaped case defining a through hole at a center thereof and accommodating the magnetic core and the measurement circuit, and
the electronic component is attachable with the insulating member disposed through the through hole of the case.

9. The support insulator according to claim 7, wherein
the current sensor that is the electronic component includes
a ring-shaped magnetic core,
a measurement circuit to measure the electric current based on a variation in magnetic flux generated in the magnetic core, and
a ring-shaped case defining a through hole at a center thereof and accommodating the magnetic core and the measurement circuit, and
the electronic component is attachable to the attachment portion with the insulating member disposed through the through hole of the case.

10. The support insulator according to claim 8, wherein
the current sensor that is the electronic component further includes an extension portion extending from the case in a direction in which the through hole of the case extends, and
the electronic component is attachable with the insulating member disposed through the through hole of the case and the extension portion contacting the conductive member at a position at which the electric component is attachable.

11. The support insulator according to claim 9, wherein
the current sensor that is the electronic component further includes an extension portion extending from the case in a direction in which the through hole of the case extends, and
the electronic component is attachable to the attachment portion, with the insulating member disposed through the through hole of the case and the extension portion contacting the attachment portion.

12. A power conversion device comprising:
a main circuit comprising power conversion circuitry, the power conversion circuitry being configured to convert fed electric power into electric power to be fed to a load and feed the converted electric power to the load;
the support insulator according to claim 1; and
a housing to accommodate the main circuit and the support insulator.

13. A power conversion device comprising:
a main circuit comprising power conversion circuitry, the power conversion circuitry being configured to convert fed electric power into electric power to be fed to a load and feed the converted electric power to the load;
the support insulator according to claim 3; and
a housing to accommodate the main circuit and the support insulator.

* * * * *